United States Patent [19]

Lucas

[11] Patent Number: 4,719,642
[45] Date of Patent: Jan. 12, 1988

[54] ERROR DETECTION AND CONCEALMENT USING PREDICTED SIGNAL VALUES

[75] Inventor: Keith Lucas, Oak Ridges, Canada

[73] Assignee: Scientific Atlanta, Inc., Atlanta, Ga.

[21] Appl. No.: 706,195

[22] Filed: Feb. 27, 1985

[51] Int. Cl.$^4$ ............................................. H04B 14/06
[52] U.S. Cl. ...................................... 375/30; 358/135; 371/67
[58] Field of Search ......................... 375/27, 28, 29, 30, 375/31, 32, 33, 122; 332/11 D; 358/133, 135, 136, 138; 371/67, 68; 381/29, 30, 31; 370/7

[56] References Cited

U.S. PATENT DOCUMENTS

| | | | |
|---|---|---|---|
| 2,732,424 | 1/1956 | Oliver | 375/27 |
| 3,026,375 | 3/1962 | Graham | 375/31 |
| 3,378,641 | 4/1968 | Varsos et al. | 375/27 |
| 3,631,520 | 12/1971 | Atal | 375/27 |
| 3,671,935 | 6/1972 | Lipp et al. | 371/67 |
| 3,750,024 | 7/1973 | Dunn | 375/31 |
| 4,141,034 | 2/1979 | Netravali et al. | 358/135 |
| 4,144,543 | 3/1979 | Koga | 358/136 |
| 4,179,659 | 12/1979 | Tashiro | 332/110 |
| 4,470,072 | 9/1984 | Tanaka et al. | 358/135 |
| 4,475,213 | 10/1984 | Medaugh | 375/27 |
| 4,509,150 | 4/1985 | Davis | 375/30 |
| 4,549,304 | 10/1985 | Weirich et al. | 370/7 |
| 4,554,670 | 11/1985 | Aiko et al. | 375/30 |
| 4,581,741 | 4/1986 | Huffman et al. | 371/67 |

OTHER PUBLICATIONS

Steel Article, Statistical Block Protection Coding for DPCM-AQF Speech, NTC '80 IEEE 1980 National Telecommunication Conf., Nov. 30–Dec. 4, 1980.

*Primary Examiner*—Michael A. Masinick
*Assistant Examiner*—Stephen Chin
*Attorney, Agent, or Firm*—Banner, Birch, McKie & Beckett

[57] ABSTRACT

The system transmits blocks of N signal values preceded by block code words which are used at the receiver to detect errors. In the transmitter, the digital value of the intelligence signal being transmitted is sent to a predictor, a comparator, and an N-word delay line. The predictor estimates the next signal value, which is suitably delayed so that the current value and its estimate may be compared. The comparator subtracts each estimated value from the corresponding actual value, temporarily storing the difference, called a "delta value," while the entire block of N words is processed. A "Maximum Delta Encoder" encodes (with appropriate error correction) the absolute value of the maximum delta value for all N words. The resulting block code word is multiplexed into the data channel ahead of the group of N words to which it corresponds. An "N Sample Delay" is used to delay the N words so that the block code word will precede it. In the receiver, the block code word is demultiplexed and error corrected to recover the absolute value of the maximum delta value for the group of N words which follow. As each of the N words is received, it is subtracted from a predicted value generated by a predictor circuit identical to the one found in the transmitter. If the difference is greater than the maximum delta value for that block, the received signal value represents an error. The error is then concealed by replacing it with the predicted value itself. If the difference is less than or equal to the maximum delta value, the received signal is accepted as correct.

18 Claims, 2 Drawing Figures

ERROR DETECTION AND CONCEALMENT USING PREDICTED SIGNAL VALUES

BACKGROUND OF THE INVENTION

1. Technical Field

The present invention relates to the field of detection and concealment of errors in received data, and especially to detection and concealment of errors introduced into the data during its passage through the communication channel between the transmitter and the receiver.

2. Description of the Prior Art

Numerous methods exist for the detection and correction of errors in a received signal. For example, parity information can be added to the information signal before transmission to provide the means to detect and, optionally, correct errors occurring during transmission. In block coding, for example, a *single* error occurring in a sequence of $(2^M-M-1)$ bits can be corrected using M parity bits which are added to the transmitted sequence of bits. To correct k *multiple* errors in a sequence of $(2^M-kM-1)$ bits requires at least kM parity bits.

Correction of multiple errors, however, requires a system which may be very expensive to implement. Moreover, all of these methods are inefficient in their use of the communication channel. Parity bits added to the sequence of transmitted information reduce the channel capacity available for transmission of the information signal. At very high error rates in transmission, the fraction of channel capacity dedicated to the transmission of parity bits becomes excessive. Furthermore, all methods fail when the channel error rate exceeds the design limit. In the case of audio signals, established methods produce annoying "clicks" when the error rate is even close to the design limit.

Alternative systems have been developed which allow for the detection of errors but not their correction. Detected errors are instead concealed by replacing the erroneous data with an estimate. An example of this type of system is described in R. Steele and N. S. Jayant, "Statistical Block Protection Coding for DPCM-AQF Speech," *Report of the IEEE* 1980 *National Telecommunications Conference* (hereinafter cited as Steele). Steele teaches a method of block protection coding for differential pulse code modulated (DPCM) speech. Circuitry at the transmitter calculates both the magnitude of the maximum difference between adjacent speech samples in a block, and the root-mean-square (rms) value of all the adjacent differences in the block. These values are transmitted at the head of the transmitted block of speech samples. At the receiver, the difference between each sample determined to be correct and the next sample is calculated; and, if this difference is greater than the maximum as calculated prior to transmission, then the next sample is deemed to be erroneous. Concealment is accomplished by adding the rms value of the differences to the correct (earlier) sample.

SUMMARY OF THE INVENTION

It is an object of the present invention to ensure the integrity of information, such as a transmitted information signal.

It is also an object of the present invention to provide a system in which errors arising in the communication channel are detected or concealed at the receiver.

It is further an object of the present invention to utilize the difference between a predicted value of an information signal and the corresponding actual value in determining the presence of an error.

It is still further an object of the present invention to utilize the predicted value in concealing an erroneous actual value of the received information signal.

The present invention deals with detection and concealment of errors arising out of the transmission of information signals such as electrical signals representing speech. The invention seeks to reduce the amount of information which must be used to accomplish error detection and concealment by taking advantage of the statistical properties of the information signal itself to detect those errors which are subjectively most annoying. A predictor is used for both detection and concealment of transmitted errors.

The statistical properties of the information signal to be transmitted are embodied in two identical predictors, one at the transmitter and one at the receiver. Each of these predictors calculates the predicted value of the information signal at a particular time from one or more of its earlier values. The transmitter's predictor uses actual values of the yet-to-be-transmitted information signal to predict a number of such values; it then determines the difference between each predicted value and the corresponding actual value. The receiver's predictor uses actual values of the received information signal to predict these values and, similarly, determines the differences between each predicted value and the corresponding actual value.

If no errors were introduced into the information signal during its passage through the communication channel, the information signal values received would be the same as those transmitted, both predictors would predict the same values, and the differences determined at the transmitter would be the same as those determined at the receiver. Ordinarily, however, errors are introduced; and in such cases the difference determined at the receiver between an erroneous received information signal value and its corresponding prediction may be larger or smaller than the difference determined at the transmitter between the correct value and its corresponding prediction. I have found that, generally, the errors most objectionable on a subjective basis are those which would cause a large difference to exist between the received information signal value and its corresponding prediction. These errors are concealed by this invention.

Over a predetermined period of time, the transmitter circuitry evaluates the maximum value of the determined differences. This maximum is transmitted to the receiver for use in error detection and concealment. The receiver circuitry compares each determined difference with the received maximum value in effect for the period of time in question. If the difference is not greater than the maximum, no action is taken. If the difference *is* greater, the received information signal value used to calculate the difference is determined to be in error. This value is then replaced by the corresponding prediction.

In the transmitter, the digital value of the intelligence signal being transmitted is sent to a predictor, a comparator, and an N-word delay line. The predictor estimates the next signal value, which is suitably delayed so that the current value and its estimate may be compared. The comparator subtracts each estimated value from the corresponding actual value, temporarily storing the difference, called a "delta value," while the entire block of N words is processed. A "Maximum Delta Encoder" encodes (with appropriate error correction) the absolute value of the maximum delta value for all N words. The resulting block code word is multiplexed into the data channel ahead of the group of N words to which it corresponds. An "N Sample Delay" is used to delay the N words so that the block code word will precede it.

In the receiver, the block code word is demultiplexed and error corrected to recover the absolute value of the maximum delta value for the group of N words which follow. As each of the N words is received, it is subtracted from a predicted value generated by a predictor circuit identical to the one found in the transmitter. If the difference is greater than the maximum delta value for that block, the received signal value represents an error. The error is then concealed by replacing it with the predicted value itself. If the difference is less than or equal to the maximum delta value, the received signal is accepted as correct.

The invention has the advantage of efficiently using the communication channel by transmitting the minimum information necessary to allow detection and concealment of only those errors which are subjectively disturbing. The invention is capable of regenerating acceptable signals in a channel with a very high error rate, and its implementation cost is low.

DESCRIPTION OF THE PREFERRED EMBODIMENT

Figure 1:
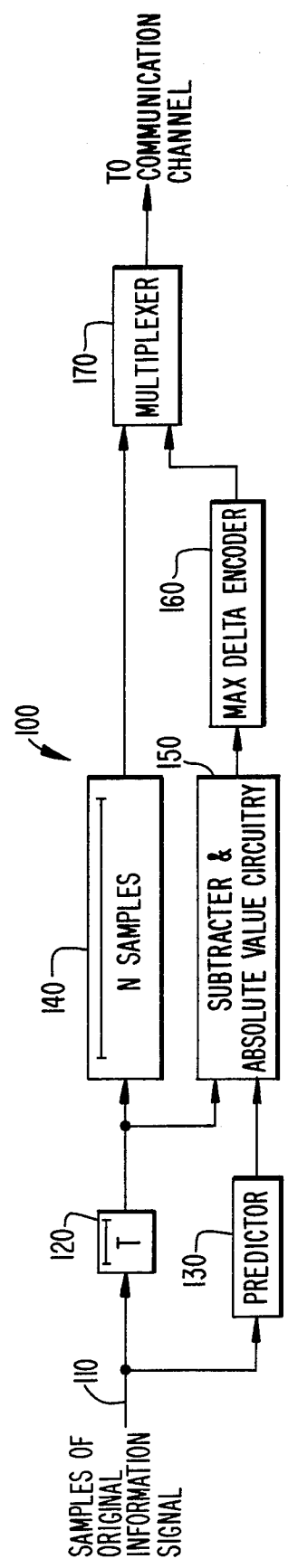
FIG. 1 is a block diagram of the preferred embodiment of the circuitry at the transmitter end of the present invention.

FIG. 1 illustrates the preferred embodiment of the transmitter circuitry of the present invention. Periodic samples of the information signal are input to delay circuit 120 and predictor 130. The information signal is preferably a correlated signal, such as audio or video; but it may also be non-correlated and may even be a random process. Correlated signals are those in which one or more parameters of information yet to be received is, to some degree, predictable from information already received. (Audio and video television signals are examples of correlated signals.) The format of the signal could be analog, quantized, or digital, and is preferably digital.

Predictor 130 calculates a predicted value corresponding to the next actual value of the information signal. This is done using one or more previous actual values, as well as the statistical properties of the information signal. Such predictors are well known, as shown, for example, in Oliver, U.S. Pat. No. 2,732,424 (weighted sum of several preceding signal values used for prediction in television transmission); Atal, U.S. Pat. No. 3,631,520 (predictor having variable prediction parameters to deal with signals having varying statistical properties, such as speech); and Graham, U.S. Pat. No. 3,026,375 (recursive prediction to deal with rapid signal changes in transmission of television), all of which are incorporated herein by reference.

Delay circuit 120 delays the current signal value by a time T, corresponding to twice the delay created in the predictor circuit. The output of the predictor is the prediction for the next signal value. The delay time T, being twice the delay of the predictor circuit, ensures that the output of delay circuit 120 and that of predictor 130 correspond to the same signal value. Delay circuit 120 can be any conventional circuit capable of producing the requisite delay.

The delayed signal is input to both N—sample delay line 140 and subtracter 150. The absolute value of the difference between the actual and predicted signal values (the delta value) is output to encoder 160, which stores the maximum delta value encountered in each block of N samples and, at the end of the block of N samples, encodes this maximum delta value with appropriate error correction bits.

The encoded maximum delta value is input to multiplexer 170, which multiplexes the maximum delta value ahead of the N sample values to which it corresponds. N—sample delay line 140 ensures that the encoded maximum delta value precedes the N samples. The output of multiplexer 170 is sent to the communication channel. It is also possible to transmit the encoded maximum delta value by a separate channel.

Figure 2:
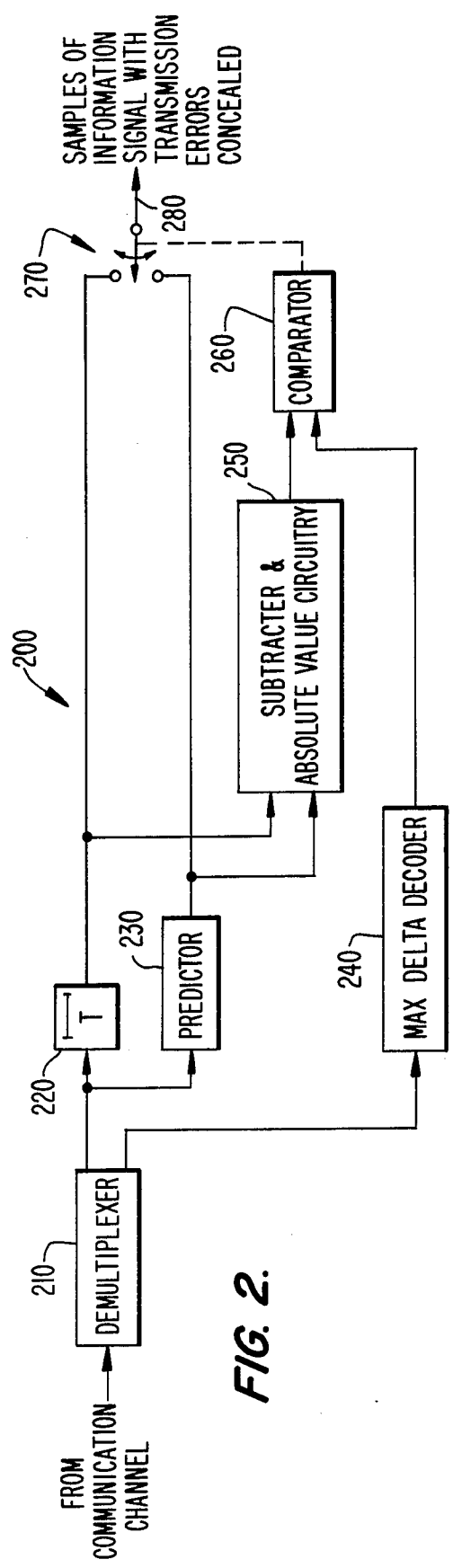
FIG. 2 is a block diagram of the preferred embodiment of the circuitry at the receiver end of the present invention.

FIG. 2 shows the preferred embodiment of the receiver circuitry of the present invention. The block of N data words preceded by the encoded maximum delta value is received at demultiplexer 210, and the encoded maximum delta value is routed to decoder 240, which decodes and corrects errors in it. The N data words representing the information signal samples are routed to delay circuit 220 and predictor 230. Delay circuit 220 and predictor 230 are identical to delay circuit 120 and predictor 130, respectively, of the transmitter as shown in FIG. 1 and described above.

Predictor 230 calculates the next signal value, and delay circuit 220 delays the current signal value by a time T so that the predicted signal value and its corresponding actual signal value are available concurrently. The predicted signal value is input to both subtracter 250 and one of the two mutually exclusive terminals of double throw switch 270. The corresponding actual signal value is input to the other terminal.

Subtracter 250, which is identical to subtracter 150 of the transmitter as shown in FIG. 1, determines the absolute value of the difference between the predicted signal value and the corresponding received actual signal value and outputs this absolute value (the current delta value) to comparator 260.

Comparator 260 compares its two inputs and determines that there is no error if the current delta value is less than or equal to the maximum delta value. It then causes switch 270 to connect the received actual signal value to output line 280.

If and only if the current delta value is greater than the maximum delta value does comparator 260 detect an error in transmission. The error is concealed by replacing the erroneous actual signal value with the corresponding predicted signal value. This is done, by comparator 260, by switching switch 270 to connect the predicted signal value to line 280.

In this way, received signal values having a difference from their corresponding predicted signal values larger than a maximum difference calculated prior to transmission are treated as erroneous. The erroneous signal value is concealed by replacing it with the corresponding predicted signal value.

The preferred embodiment has been described by using digital data as the input signal. It is also possible to construct this system using analog or quantized input signals by simply replacing the subtracters in circuits 150 and 250 with differential amplifiers. The signals may then be transmitted either as analog or digital.

Additionally, the signals may be transmitted as analog while the maximum delta value is transmitted as digital, or both may be analog signals. Further, the maximum delta value may be transmitted in a separate communication channel. Also, this invention could be carried out using either serial or parallel calculation and/or transmission techniques.

Although illustrative embodiments of the present invention have been described in detail with reference to the accompanying drawings, it is to be understood that the invention is not limited to those precise embodiments and that various changes or modifications may be effected therein by one skilled in the art without departing from the scope or spirit of the invention.

The method of construction may depend on the application. In the case of audio signals, it is expected that an all-digital implementation would be used, although partially analogue techniques are possible. In the case of video information, the maximum delta value may be transmitted digitally during the line-blanking interval, or in any other digital channel associated with the video signal. The predictor in this case might employ the previous TV line of the video signal.

The technique may be combined with other error-correction/concealment methods. The technique itself may be enhanced to provide an error correction capability (rather than being restricted to error concealment). Error detection methods exist which specify the type of error which has occurred, but cannot define its precise location. The maximum delta value could be used for that purpose. One such method requires the introduction of a single additional data word to the N-word group. This word is the modulo 1 addition of the other N words in the group.

I claim:

1. A method of enabling the detection of errors introduced in an informal signal during transmission of the informal signal through a communication channel to a receiver, said method comprising the steps of:
   predicting from the untransmitted information signal a plurality of actual values of the information signal and generating therefrom a plurality of predicted values;
   determining the difference between each of the plurality of actual values and the corresponding predicted value;
   developing an error detection signal based on a comparison of the determined differences between each of the plurality of actual values and the corresponding predicted value;
   transmitting the plurality of actual values through the channel to the receiver; and
   transmitting the error detection signal to the receiver.

2. The method of claim 1 wherein the information signal is a correlated signal.

3. A method of detecting errors introduced into an information signal during passage of the information signal through a communication channel to a receiver, said method comprising the steps of:
   predicting from the untransmitted information signal a plurality of actual values of the information signal;
   determining the difference between each of the plurality of actual values and the corresponding prediction;
   developing an error detection signal from the determined differences between each of the plurality of actual values and the corresponding prediction;
   transmitting the plurality of actual values through the channel to the receiver;
   transmitting the error detection signal to the receiver;
   receiving the transmitted plurality of actual values and the transmitted error detection signal at the receiver;
   predicting from the received actual values each of the plurality of actual values of the received information signal;
   determining the difference between each of the plurality of received actual values and the corresponding prediction; and
   comparing the received error detection signal with determined differences between each of the plurality of received actual values in the corresponding prediction to detect errors.

4. The method of claim 3 wherein the information signal is a correlated signal.

5. A method of enabling the detection of errors introduced in an information signal during transmission of the information signal through a communication channel to a receiver, said method comprising the steps of;
   periodically sampling the information signal;
   calculating from the untransmitted samples a predicted value corresponding to each sample;
   determining the difference between each sample and the corresponding predicted value;
   developing an error detection signal based on a comparison of the determined differences between each sample and the corresponding predicted value;
   transmitting the samples through the channel to the receiver; and
   transmitting the error detection signal to the receiver.

6. The method of claim 5 wherein the information signal has known statistical properties and said step of calculating from the untransmitted samples a predicted value corresponding to each sample comprises calculating the predicted value based solely on the value of one or more previous untransmitted samples and the statistical properties of the information signal.

7. A method of detecting errors introduced in an information signal during passage of the information signal through a communication channel to a receiver, said method comprising the steps of:
   periodically sampling the information signal;
   calculating from the untransmitted samples a predicted value corresponding to each sample;
   determining the difference between each sample and the corresponding predicted value;
   developing an error detection signal from the determined differences between each sample and the corresponding predicted value;
   transmitting the samples through the channel to the receiver;
   transmitting the error detection signal to the receiver;
   receiving the transmitted samples and the transmitted error detection signal at the receiver;
   calculating from the received samples a predicted value corresponding to each of the samples;
   determining the difference between each received sample and the corresponding predicted value; and
   comparing the received error detection signal with the determined differences between each received sample and the corresponding predicted value to detect errors.

8. The method of claim 7 wherein:
the information signal has known statistical properties;
said step of calculating from the untransmitted samples a predicted value comprises calculating the predicted value based solely on the value of one or more previous untransmitted samples and the statistical properties of the information signal; and
said step of calculating from the received samples a predicted value comprises calculating the predicted value based solely on the value of one or more previous received samples and the statistical properties of the information signal.

9. A method of detecting and concealing errors introduced into an information signal during passage of the information signal through a communication channel to a receiver, said method comprising the steps of:
receiving a plurality of actual values of the information signal;
predicting from the received actual values each of the plurality of actual values of the received information signal;
determining the difference between each of the plurality of received actual values and the corresponding prediction;
receiving a maximum difference value;
comparing the received maximum difference value with the determined differences between each of the plurality of received actual values and the corresponding prediciton in order to detect errors; and
substituting, for any received actual value detected to be in error, the corresponding prediction.

10. The method of claim 9 further comprising the inital steps of:
predicting from the untransmitted information signal a plurality of actual values of the information signal;
determining the difference between each of the plurality of actual values of the untransmitted information signal and the corresponding prediction;
evaluating the maximum value of the determined differences between each of the plurality of actual values of the untransmitted information signal and the corresponding prediction over a predetermined period of time; and
transmitting the evaluated maximum value to the receiver as the maximum difference value.

11. A method of detecting and concealing errors introduced into an information signal during passage of the information signal through a communication channel to a receiver, said method comprising the steps of:
receiving a plurality of samples of the information signal;
calculating from the received samples a predicted value corresponding to each of the samples;
determining the difference between each received sample and the corresponding predicted value;
receiving a maximum difference value;
comparing the received maximum difference value with the determined differences between each received sample and the corresponding predicted value in order to detect errors; and
substituting, for any received sample detected to be in error, the corresponding predicted value.

12. The method of claim 11 further comprising the initial steps of:
calculating from the untransmitted information signal a predicted value corresponding to each of a plurality of samples of the information signal;
determining the difference between each sample of the untransmitted information signal and the corresponding predicted value;
evaluating the maximum value of the determined differences between each sample of the untransmitted information signal and the corresponding predicted value for a predtermined number of samples; and
transmitting the evaluated maximum value to the receiver as the maximum difference value.

13. A method of detecting errors in actual signal values comprising the steps of:
periodically sampling a received signal for producing a plurality of actual signal values;
predicting an actual signal value based on the plurality of actual signal values;
comparing the predicted signal value to the actual signal value, producing a delta value;
determining a maximum delta value for a group of N consecutive samples, where N is a positive integer; and
detecting an error if and only if the produced delta value is greater than the predetermined maximum delta value.

14. The method of claim 13 where N is greater than one.

15. A method of detecting and concealing errors in actual signal values comprising the steps of:
predicting an actual signal value based on at least one previous actual signal value;
comparing the predicted signal value to the corresponding actual signal value, producing a delta value;
comparing the delta value to a predetermined maximum delta value;
detecting an error if and only if the delta value is greater than the predetermined maximum delta value; and
if an error is detected, concealing the error by replacing the actual signal value with the corresponding predicted signal value.

16. The method of claim 15 wherein the actual signal values are represented by periodic samples, the predetermined maximum delta value being determined for a group of N consecutive periods, where N is a positive integer.

17. The method of claim 16 where N is greater than one.

18. A method of generating error detection information from periodically sampled actual signal values, said method comprising the steps of:
predicting an actual signal value based on at least one previous actual signal value;
comparing the predicted signal value to the corresponding actual signal value, producing a delta value; and
repeating said steps of predicting and comparing for a total of N actual signal values, where N is a positive integer, while:
delaying the actual signal value a period of time corresponding to N sampling rates, and
storing the largest delta value as the error detection information.

* * * * *